(12) United States Patent
Lopp et al.

(10) Patent No.: US 12,049,691 B2
(45) Date of Patent: Jul. 30, 2024

(54) TEMPERATURE-CONTROLLED SHIELD, MATERIAL DEPOSITION APPARATUS AND METHOD FOR DEPOSITING A MATERIAL ONTO A SUBSTRATE

(71) Applicant: Applied Materials, Inc., Santa Clara, CA (US)

(72) Inventors: Andreas Lopp, Freigericht (DE); Stefan Bangert, Steinau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/332,822

(22) Filed: May 27, 2021

(65) Prior Publication Data

US 2021/0381102 A1 Dec. 9, 2021

Related U.S. Application Data

(60) Provisional application No. 63/034,529, filed on Jun. 4, 2020.

(51) Int. Cl.
*C23C 14/54* (2006.01)
*C23C 14/24* (2006.01)
*H01J 37/32* (2006.01)

(52) U.S. Cl.
CPC ............ *C23C 14/542* (2013.01); *C23C 14/24* (2013.01); *H01J 37/32651* (2013.01)

(58) Field of Classification Search
None
See application file for complete search history.

(56) References Cited

U.S. PATENT DOCUMENTS

| 5,186,872 | A | * | 2/1993 | Nishiwaki | B01D 3/346 264/5 |
| 2002/0046945 | A1 | * | 4/2002 | Hosokawa | C23C 14/56 204/298.18 |
| 2005/0000448 | A1 | | 1/2005 | Guido et al. | |
| 2005/0008778 | A1 | | 1/2005 | Utsugi et al. | |
| 2007/0113784 | A1 | | 5/2007 | Pagani | |
| 2007/0137568 | A1 | * | 6/2007 | Schreiber | C23C 14/562 118/726 |
| 2009/0068788 | A1 | | 3/2009 | Treude | |

FOREIGN PATENT DOCUMENTS

| EP | 0048884 A2 | 4/1982 | | |
| JP | H0570932 A | 3/1993 | | |
| JP | H09-67664 A | 3/1997 | | |
| JP | 3735846 B2 | * | 1/2006 | ............ C23C 14/02 |
| JP | 2007270251 A | 10/2007 | | |
| JP | 2008248362 A | 10/2008 | | |
| TW | 201445005 A | 12/2014 | | |

(Continued)

OTHER PUBLICATIONS

In re Mraz, 455 F.2d 1069, 173 USPQ 25 (CCPA 1972).*

(Continued)

*Primary Examiner* — Charles Capozzi
(74) *Attorney, Agent, or Firm* — Patterson + Sheridan, LLP

(57) ABSTRACT

A temperature-controlled shield for an evaporation source is described. The temperature-controlled shield is configured to provide a pre-heating zone or a post-cooling zone.

5 Claims, 4 Drawing Sheets

(56) References Cited

FOREIGN PATENT DOCUMENTS

TW 201926418 A 7/2019

OTHER PUBLICATIONS

Claims filed Dec. 11, 2023 for corresponding Taiwanese Appl. No. 110119021 in translatable format.*
English translation for JP2008-248362.*
English translation for JPH0967664A (corresponding to JP3735846).*
Taiwan Office Action dated Aug. 18, 2022 for Application No. 110119021 (APPM/44018268TW).
International Search Report and Written Opinion dated Oct. 13, 2021 for Application No. PCT/US2021/034598.
Taiwan Office Action dated Mar. 14, 2022 for Application No. 110119021 (44018268TW01).
Taiwan Office Action dated Dec. 13, 2021 for Application No. 110119021 (44018268TW01).
Taiwan Office Action dated Sep. 22, 2023 for Application No. 110119021 (44018268TW01).
Taiwan Notice of Allowance dated Jan. 11, 2024 for Application No. 110119021 (44018268TW01).
Japanese Office Action dated Feb. 27, 2024 for Application No. 2022-574431 (44018268JP01).

* cited by examiner

TEMPERATURE-CONTROLLED SHIELD, MATERIAL DEPOSITION APPARATUS AND METHOD FOR DEPOSITING A MATERIAL ONTO A SUBSTRATE

CROSS-REFERENCE TO RELATED APPLICATIONS

This application claims benefit of U.S. Provisional Patent Application Ser. No. 63/034,529, filed on Jun. 4, 2020, which is herein incorporated by reference in its entirety.

FIELD OF INVENTION

Embodiments of the present disclosure relate to substrate coating by thermal evaporation in a vacuum chamber. Embodiments of the present disclosure further relate to material deposition of evaporated material onto a substrate. Embodiments also relate to temperature-controlled deposition of material onto a substrate.

BACKGROUND

Various techniques for deposition on a substrate, for example, chemical vapor deposition (CVD) and physical vapor deposition (PVD) are known. For deposition at high deposition rates, thermal evaporation may be used as a PVD process. For thermal evaporation, a source material is heated up to produce a vapor that may be deposited, for example, on a substrate. Increasing the temperature of the heated source material increases the vapor concentration and can facilitate high deposition rates. The temperature for achieving high deposition rates depends on the source material physical properties, e.g. vapor pressure as a function of temperature, and substrate physical limits, e.g. melting point.

For example, the material to be deposited on the substrate can be heated in a crucible to produce vapor at an elevated vapor pressure. The vapor can be transported from the crucible to a heated vapor distributor with a plurality of nozzles. The vapor can be directed by the one or more nozzles onto a substrate in a coating volume, for example, in a vacuum chamber.

The deposition of a metal, e.g. lithium, on a flexible substrate, e.g. on a copper substrate, by evaporation may be used for the manufacture of batteries, such as Li-batteries. For example, a lithium layer may be deposited on a thin flexible substrate for producing the anode of a battery. After assembly of the anode layer stack and the cathode layer stack, optionally with an electrolyte and/or separator therebetween, the manufactured layer arrangement may be rolled or otherwise stacked to produce the Li-battery.

Surfaces of the components, e.g. the vacuum chamber walls of the vacuum chamber, may be exposed to the vapor and may be coated. Frequent maintenance to remove condensates is not practical for high volume manufacturing, e.g. web coating on thin foils. Further, expensive coating material may be wasted if components of the vacuum chamber are different from the substrate to be coated.

Additionally, the material to be deposited is heated up to high temperatures, thereby providing a high heat load to the substrate to be coated. High temperatures, however, may negatively influence the substrate. It is thus beneficial, to provide an improved material deposition apparatus to at least partially overcome the problems in the art.

SUMMARY

According to one embodiment, a temperature-controlled shield for an evaporation source is provided. The temperature-controlled shield is configured to provide a pre-heating zone or a post-cooling zone.

According to one embodiment, a material deposition apparatus for depositing an evaporated material onto a substrate is provided. The material deposition apparatus includes one or more temperature-controlled shields according to embodiments of the present disclosure.

According to one embodiment, a material deposition apparatus for depositing an evaporated material onto a substrate is provided. The material deposition apparatus includes an evaporation source for providing the evaporated material to the substrate, the evaporation source having a first end and a second end opposite the first end and a surface having a length in between the first end and the second end; and one or more temperature-controlled shields being arranged at at least one of the first end or the second end of the evaporation source, the one or more temperature-controlled shields extending outward from the evaporation source, wherein the one or more temperature-controlled shields provide a width of at least 20% of the length of the surface in between the first end and the second end of the evaporation source.

According to one embodiment, a material deposition apparatus for depositing an evaporated material onto a substrate is provided. The material deposition apparatus includes an evaporation source for providing the evaporated material to the substrate, the evaporation source having a first end and a second end opposite the first end; and one or more temperature-controlled shields being arranged at at least one of the first end or the second end of the evaporation source, the one or more temperature-controlled shields extending outward from the evaporation source by a wide-angle.

According to one embodiment, a material deposition apparatus for depositing an evaporated material onto a substrate is provided. The material deposition apparatus includes a substrate transportation device for transporting the substrate along a substrate transportation direction; and at least two evaporation sources along the substrate transportation direction for providing the evaporated material to the substrate, the at least two evaporation sources each include one or more asymmetric temperature-controlled shields.

According to one embodiment, an evaporation source for providing an evaporated material to a substrate in a vacuum chamber is provided. The evaporation source includes a nozzle assembly shield having a plurality of nozzles arranged in at least one row, the row including two outermost nozzles, wherein the two outermost nozzles are tilted in different directions.

According to one embodiment, an evaporation source for providing an evaporated material to a substrate in a vacuum chamber is provided. The evaporation source includes a nozzle assembly shield having a first end and a second end and a surface between the first and the second end facing the substrate, the nozzle assembly shield having a plurality of openings being arranged in at least one row at the surface between the first end and the second end, the at least one row having a first outermost opening provided adjacent to the first end and a second outermost opening provided adjacent to the second end; and a plurality of nozzles extending through the plurality of openings, wherein the plurality of nozzles comprises a first outermost nozzle extending through the first outermost opening and a second outermost nozzle extending through the second outermost opening, the first and second outermost nozzle being tilted by an angle with respect to the surface between the first end and the second end.

According to one embodiment, a method for depositing a material onto a substrate in a vacuum chamber is provided. The method includes evaporating the material in an evaporation source having a vapor emission area; and guiding the evaporated material by a temperature-controlled shield towards a substrate area, the substrate area being larger than the vapor emission area.

According to one embodiment, a method of manufacturing an anode of a battery is provided. The method of manufacturing an anode of a battery includes a method for depositing a material onto a substrate in a vacuum chamber according to any of the embodiments described herein.

According to one embodiment, a method of manufacturing an anode of a battery is provided. The method includes guiding a web comprising or consisting of an anode layer in a material deposition apparatus according to embodiments of the present disclosure; and depositing a lithium containing material or lithium on the web with the vapor deposition apparatus.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the present disclosure are also directed at methods for operating the described apparatus. It includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The embodiments provided herein relate to thin film coating by evaporation, particularly to thin film coating in a vacuum chamber. Typically, the material to be coated is heated up to a material-specific temperature to be evaporated. In general, higher evaporation rates can be provided at higher temperatures. The respective temperature for a specific coating rate depends amongst others e.g. on the material vapor pressure. For high deposition rate processes the condensation heat load of the material may dominate the heat load on the substrate.

In evaporation systems, the evaporated material will condensate on surfaces of the system components having a lower temperature than the evaporated material. For thermal coating of a substrate, the substrate includes a lower temperature such that the evaporated material may be coated onto the substrate to form a thin layer on the substrate. However, coating or material deposition based on temperature differences between the material to be deposited and the substrate also provides condensation energy to the substrate. Thus, the condensation energy provided by the deposited material heats up the substrate, particularly at positions where the evaporated material directly hits the substrate.

It is therefore beneficial to provide systems, apparatuses and methods avoiding a focused condensation energy to the substrate to be coated as well as systems, apparatuses and methods that provide a better distribution of heat i.e. of the condensation energy over the substrate to be coated.

Figure 1:
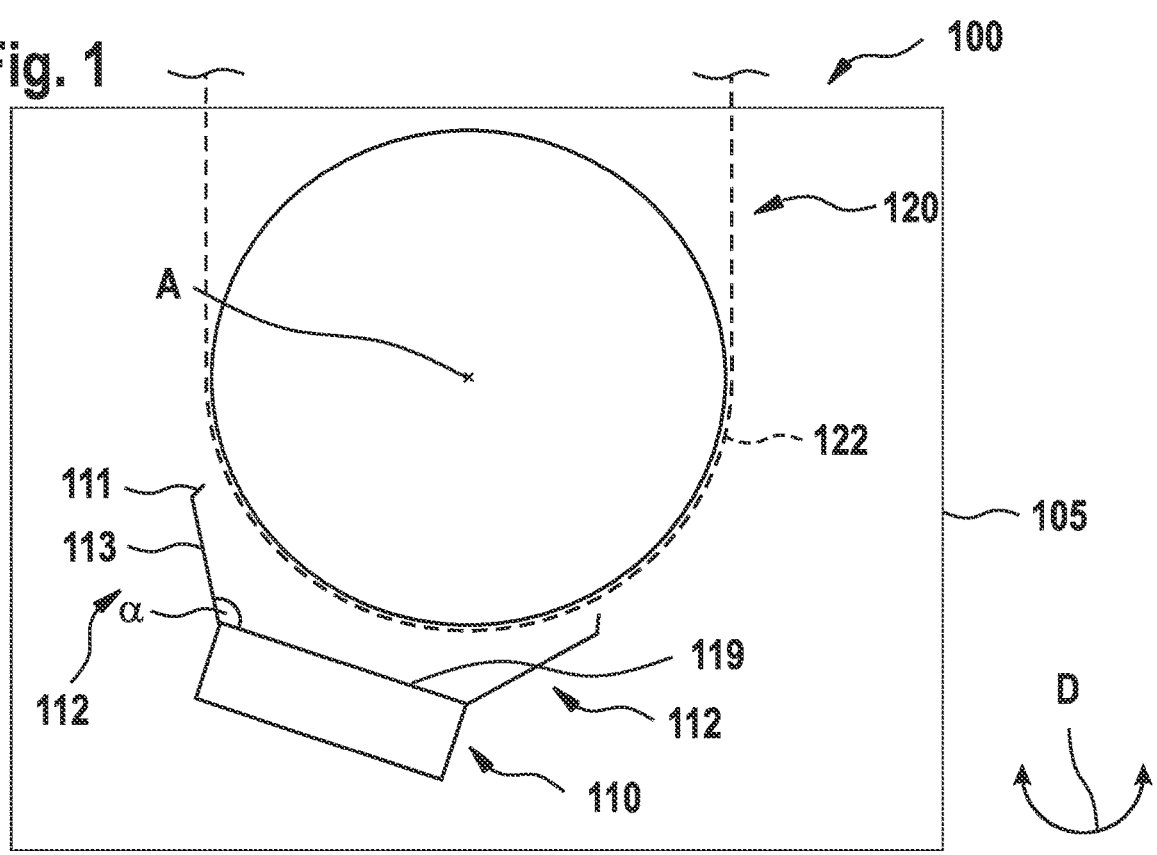
FIG. 1 shows a schematic view of a material deposition apparatus according to embodiments described herein.

FIG. 1 exemplarily shows a material deposition apparatus according to embodiments described herein that can be combined with any other embodiment described herein. The material deposition apparatus 100 may include a vacuum chamber 105. A vacuum may be provided in the vacuum chamber. For example, the material deposition apparatus may include a vacuum pump for providing the vacuum in the vacuum chamber.

The term "vacuum" as used herein can be understood in the sense of a technical vacuum having a vacuum pressure of less than, for example, 10 mbar. Typically, the pressure in a vacuum chamber as described herein may be between $10^{-4}$ mbar and about $10^{-8}$ mbar, more typically between $10^{-4}$ mbar and $10^{-7}$ mbar, and even more typically between about $10^{-5}$ mbar and about $10^{-6}$ mbar. In some embodiments, the total pressure in the one or more vacuum chambers may range from about $10^{-4}$ mbar to about $10^{-7}$ mbar. Accordingly, the vacuum chamber can be a "vacuum deposition chamber", i.e. a vacuum chamber configured for vacuum deposition.

According to embodiments that can be combined with any other embodiment described herein, the material deposition apparatus may include an evaporation source 110. The evaporation source is configured to provide evaporated material towards a substrate 122. The evaporation source 110 can be provided in the vacuum chamber 105 or can at least partially be provided in the vacuum chamber 105.

According to embodiments that can be combined with any other embodiment described herein, the material deposition apparatus may include a substrate transportation device 120. The substrate transportation device may be configured to transport the substrate 122. The substrate 122 may be arranged around the substrate transportation device 120. The substrate transportation device 120 may be a coating drum as exemplarily shown in FIG. 1. The coating drum may include a curved drum surface, and the vapor deposition apparatus may be configured to move the substrate 122 on the curved drum surface past the evaporation source 110 in a circumferential direction or substrate transport direction D. For example, the substrate may be a flexible web or foil, and the material deposition apparatus may be a roll-to-roll deposition apparatus. The coating drum may be a cylinder extending in a length direction perpendicular to the paper plane of FIG. 1. The substrate transportation device may be movable, i.e. the coating drum may be rotated around axis A. The substrate transportation device may be moved or rotated clockwise or counterclockwise. The substrate transportation device may change direction during deposition, e.g. when the substrate transportation device is rotated clockwise during deposition, the rotational direction may be changed to counterclockwise and vice versa. The substrate may be moved in the circumferential direction or the substrate transportation direction indicated by arrow D in FIG. 1.

According to some embodiments, which can be combined with other embodiments described herein, the coating drum may be a gas cushion coating drum. The gas cushion coating drum provides a cooling gas between the surface of the drum and the substrate. For example, the drum and the cooling gas can be cooled to temperatures below room temperature. Heat can be removed from the substrate to allow for higher deposition rates without damaging the thin foil or web on which the material is deposited.

For a gas cushion roller, a first subgroup of gas outlets, i.e., the open gas outlets, can be provided in a web guiding region of the processing drum. A second subgroup of gas outlets, i.e., closed gas outlets, are provided outside the web guiding region. Since gas is only emitted in the web guiding region where it is needed to form the hover cushion, no or little gas is directly emitted into a region not overlapped by the web, waste of gas may be reduced and/or a better vacuum may be maintained at lesser strain on the pump system.

According to some embodiments, which can be combined with other embodiments described herein, additionally or alternatively to the subgroups of gas outlets, the outer surface of the processing drum may be coated with a microporous surface. The microporous surface may allow for a small amount of cooling gas to flow from inside the processing drum to the surface of the processing drum. The cooling gas may form a gas cushion between the processing drum and the web or foil guided over the processing drum for material deposition thereon.

According to embodiments that can be combined with any other embodiment described herein, the substrate can be a thin substrate, e.g. a foil or web. The substrate to be coated may have a thickness of 50 µm or less, particularly 20 µm or less, or even 10 µm or less. For example, a metal foil or a flexible metal-coated foil may be coated in the vapor deposition apparatus. In some implementations, the substrate 10 is a thin copper foil or a thin aluminum foil having a thickness below 30 µm, e.g. 10 µm or less.

According to embodiments that can be combined with any other embodiment described herein, the material deposition apparatus may include a substrate provision or unwinding roll (not shown in FIG. 1) for providing an unprocessed substrate. The substrate provision or unwinding roll may be moved i.e. rotated such that the substrate may be unrolled from the substrate provision or unwinding roll. Additionally, the material deposition apparatus may include a substrate receiving roll for taking up the processed substrate after deposition of material onto the substrate has taken place. The substrate receiving roll may be moved, i.e. the substrate receiving roll may be rotated for taking up the processed substrate. The substrate receiving roll and the substrate provision or unwinding roll may be rotated in the same direction, i.e. both rolls may be rotated clockwise or the substrate provision or unwinding roll may be rotated in opposing directions, i.e. one roll may be rotated clockwise and the other roll may be rotated counterclockwise or vice versa.

It is however to be understood that the substrate transportation device can also be a roll-to-roll transportation device although not shown in FIG. 1. The roll-to-roll transportation device may include an unwinding or substrate provision roll from which the unprocessed substrate may be provided. The roll-to-roll transportation device may further include a receiving roll for rolling up the processed substrate. The unwinding or substrate provision roll and the receiving roll may be each provided in different vacuum chambers compared to the evaporation source or may be provided in the same vacuum chamber as the evaporation source. Between the unwinding roll and the receiving roll, the substrate may be provided in vicinity to the evaporation source for depositing material onto the substrate. For example, the substrate may be "spanned" between the unwinding roll and the receiving roll and may be guided above the evaporation source for receiving the evaporated material. For example, the substrate may be provided with defined and/or controlled forces. A substrate tensioner may be provided.

According to embodiments that can be combined with any other embodiment described herein, the evaporation source 110 may have a first end and a second end opposite the first end. The first end and the second end may define a space in between. The term "a second end opposite the first end" as used throughout the present disclosure may be understood as two sides of the evaporation source being arranged next to each other. For example, the evaporation source may include a first wall and a second wall extending in the same direction and being arranged next to each other. The first end and the second end may be understood as the side wall limitations of the evaporation source. In particular, the first end and the second end may define a surface 119 in between, i.e. a surface that may be substantially perpendicular to the first wall and the second wall of the evaporation source. The surface of the evaporation source may be aligned with the substrate transportation device, i.e. the surface 119 of the evaporation source may be oriented such that a provision of material to be deposited may be enhanced.

According to embodiments that can be combined with any other embodiment described herein, the evaporation source may provide material to be deposited to the substrate. The evaporation source may include a crucible where the material to be deposited may be evaporated by providing a temperature to the material suitable to evaporate the material. For example, the material to be deposited can include, for example, metal, in particular lithium, metal alloys, and other vaporizable materials or the like which have a gaseous phase under given conditions. According to yet further embodiments, additionally or alternatively, the material may include magnesium (Mg), ytterbium (Yb) and lithium fluoride (LiF).

Further, the evaporation source may include a distributor. The distributor may distribute the evaporated material. The material may be provided in the distributor, for example, by the crucible being connected to the distributor via an inlet opening. The distributor may have one or more openings. Evaporated material to be deposited can exit the distributor through the openings. The source material can be deposited on the substrate 122 by a plurality of nozzles extending through the openings. In other words, the evaporation source may include one or more nozzles for providing evaporated material to the substrate. The material to be deposited may e.g. be sprayed to the substrate by the plurality of nozzles.

According to embodiments that can be combined with any other embodiment described herein, a temperature-controlled shield 112 is provided. The temperature-controlled shield is configured to provide a heating zone or a cooling zone, particularly a pre-heating zone and a post-cooling zone. In particular, the temperature-controlled shield may be configured to provide a pre-heating zone or a post-cooling zone in the substrate transportation device 120 i.e. towards the substrate 122 being transported by the substrate transportation device or at the substrate 122. The temperature-controlled shield 112 may include one of a heating device or a cooling device. The temperature-controlled shield may be provided at the evaporation source 110. In particular, one or more temperature-controlled shields may be provided at the evaporation source. The temperature-controlled shield 112 may be heatable, such that vapor condensation on the temperature-controlled shield 112 can be reduced or prevented when the temperature-controlled shield 112 is heated to an operation temperature, e.g. an operation temperature of 500° C. or more in some embodiments.

According to embodiments of the present disclosure, the temperature-controlled shield has a width along the transport direction which is at least 10% larger, particularly at least 20% larger than the corresponding width of the evaporation source. Accordingly, material deposition is not limited to an area of the evaporation source in the transport direction. Limiting the plume of material to an area of the evaporation source may result in a sudden increase in temperature of the substrate, which may result in wrinkles and warping of the substrate, e.g. a thin foil or web. Accordingly, the plume of material from the evaporation source is allowed to spread towards the sides of the evaporation zone for having a pre-heating zone and/or a post-cooling zone. As the temperature increase is directly correlated to the amount of material deposited, the extended shape of the heated shield results in low deposition rate at the entrance. The deposition rate increases, for example, continuously increases up to a maximum deposition rate at the main body of the evaporation source. As described herein, the heat load is mainly provided by the condensation energy. Accordingly, the temperature profile of the web or foil is proportional to the deposition rate. Accordingly, the temperature profile increases similar to the above described profile of the deposition rate.

According to embodiments that can be combined with any other embodiment described herein, the temperature-controlled shield may include a heat-conducting material. The temperature-controlled shield may include a material suitable for contact heating or cooling. For example, the temperature-controlled shield may be made of a metal material, e.g. of stainless steel, Mo, Ta, W, Invar or other high temperature materials or high temperature metals. For example, also AlN may be provided as good heat conduction ceramic)

According to embodiments that can be combined with any other embodiment described herein, the one or more temperature-controlled shields may be provided at the first and second end of the evaporation source. In particular, a first temperature-controlled shield may be provided at the first end of the evaporation source and a second temperature-controlled shield may be provided at the second end of the evaporation source. Additionally or alternatively, a first portion of the temperature-controlled shield may be provided at the first end of the evaporation source and a second portion of the temperature-controlled shield may be provided at the second end of the evaporation source.

In other words, the temperature-controlled shield 112 does not contact the substrate transportation device 120, such that the substrate supported on the substrate transportation device 120 can move past the evaporation source 110 and past the temperature-controlled shield 112 during material deposition. The temperature-controlled shield 112 may only leave a small gap between the temperature-controlled shield 112 and the substrate transportation device 120, e.g. a gap of 5 mm or less, 3 mm or less, 2 mm or less, or even about 1 mm, such that hardly any vapor can propagate past the temperature-controlled shield, e.g. in a lateral direction.

According to embodiments that can be combined with any other embodiment described herein, the temperature-controlled shield may extend along the circumferential direction or substrate transportation direction D. The temperature-controlled shield may include a width dimension along the axis of the substrate transportation device 120 and a length dimension in a direction different from the axis of the substrate transportation device 120 i.e. in the circumferential direction or substrate transportation direction D.

According to embodiments that can be combined with any other embodiment described herein, the temperature-controlled shield may extend radially or laterally away from the evaporation source. In the following, such a temperature-controlled shield may also be referred to as an "elongated shield". For example, the temperature-controlled shield may include a straight portion 113 extending radially away or outward from the evaporation source. The temperature-controlled shield or the straight portion may be directed from the evaporation source towards the substrate 122. The temperature-controlled shield or the straight portion 113 may delimit a deposition area towards the substrate. The temperature-controlled shield or the straight portion may be angled with respect to the evaporation source. For example, the temperature-controlled shield may be arranged in a wide-angle α with respect to the evaporation source 110 i.e. with respect to the surface 119 of the evaporation source between the first end and the second end of the evaporation source. The wide-angle may be between 95° and 180°, particularly between 110° and 140°, more particularly between 110° and 130°.

According to embodiments that can be combined with any other embodiment described herein, the temperature-controlled shield 112 may be bent or may include a bent portion or bent end 111. The bent portion may be bent with respect to the straight portion 113. The bent end 111 may further delimit a deposition area between the evaporation source and the substrate. The bent portion or bent end may be tilted towards the substrate, i.e. the bent end may be closer to the substrate compared to the straight portion. In other words, the straight portion may have a greater distance to the substrate than the bent end.

According to embodiments that can be combined with any other embodiment described herein, the material deposition apparatus may include a deposition area between the evaporation source 110 and the substrate transportation device 120. The deposition area may be understood as an area where the material to be deposited is provided to the substrate. The deposition area can be filled with the material to be deposited from the evaporation source and may be limited sidewise by the one or more temperature-controlled shields, for example, to provide for a uniform material deposition.

According to embodiments that can be combined with any other embodiment described herein, the one or more temperature-controlled shields may be elongated compared to conventional shields in the art. In particular, the straight portion 113 may be elongated. An elongated temperature-controlled shield may be understood as a shield that covers or encloses a large surface area of the substrate, thereby providing a larger deposition area compared to short shields or side walls in the art, for example a shield extended at an angle of 90° from the deposition source towards the substrate. Accordingly, the one or more temperature-controlled shields may be arranged at at least one of the first end or the second end of the evaporation source and may extend outwardly towards the substrate transportation device and may be configured to enlarge the deposition area, particularly as compared to a straight shield extending at an angle of 90° towards the substrate.

According to embodiments that can be combined with any other embodiment described herein, the one or more temperature shields each may have a length of at least 20% of the length of the surface 119 in between the first end and the second end of the evaporation source 110.

According to embodiments that can be combined with any other embodiment described herein, the one or more temperature-controlled shields may be heated. The temperature of the shield may be controlled such that condensation of the material to be deposited is prevented or avoided. If material to be deposited condensates at the shield, heating of the one or more temperature-controlled shields may lead to re-evaporation of the condensed material. Advantageously, high deposition yields can be achieved.

Further advantageously, the condensation energy brought to the substrate by the hot evaporated material may be distributed over a large area of the substrate. The temperature-controlled shields may provide for a deposition area under the substrate where material to be deposited may not actively be provided i.e. where no nozzles of the evaporation source are arranged but where material to be deposited may be provided through the temperature-controlled shield as described herein. Accordingly, when the substrate to be coated is transported along the one or more temperature-controlled shields, the material to be deposited may be provided at a lower rate in an area without nozzles as compared to the rate where the material is provided at the position having nozzles, i.e. compared to the rate where the material is provided directly by the plurality of nozzles. Accordingly, the overall temperature provided by the material to the substrate is distributed more evenly over a larger area of the substrate during coating. Therefore, temperature-dependent damage of the substrate can be avoided or prevented. In particular, wrinkles of the substrate may be avoided or prevented. Accordingly, coating of the substrate is more efficient resulting in higher yields of processed substrates and resulting in a better quality of the processed substrates.

Even further advantageously, a coating rate may be provided that is lower at the position where the substrate enters the area between the temperature-controlled shield and the substrate transportation device. Then, the coating rate may slowly be increased when the substrate proceeds towards the evaporation source, i.e. the area facing the evaporation source, where the plurality of nozzles is arranged, leading to a more uniform coating of the substrate. If a second temperature-controlled shield is present, the coating rate may decrease when the substrate further proceeds to the second temperature-controlled shield arranged at the second end of the evaporation source.

Figure 2A:
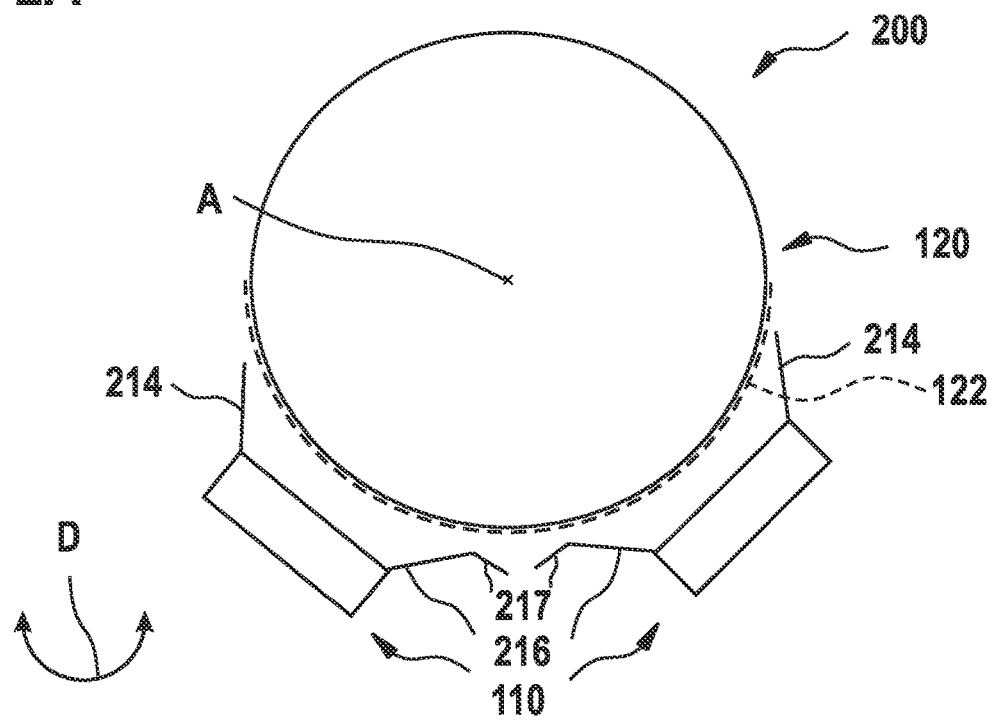
FIG. 2A shows a schematic view of a material deposition apparatus according to embodiments described herein.

According to embodiments that can be combined with any other embodiment described herein and with exemplary reference to FIG. 2A, the material deposition apparatus 200 may include at least two evaporation sources. The at least two evaporation sources may be lined up with respect to a substrate transportation direction indicated as arrow D in FIG. 2A. In other words, the at least two evaporation sources may be provided in a row or behind each other with respect to the substrate transportation direction. The at least two evaporation sources may be evaporation sources as described herein.

According to embodiments that can be combined with any other embodiment described herein, the at least two evaporation sources 110 each may include two asymmetric temperature-controlled shields or may have an asymmetric temperature-controlled shield with two portions being asymmetric with respect to each other. The term "asymmetric" as used herein may be understood in that the two temperature-controlled shields or the portions of a temperature-controlled shield may be different in shape and size. Further, it may be understood that the two asymmetric shields or the two portions may have different lengths and that the two asymmetric shields or the two portions may extend in different directions while both extending towards the substrate.

According to embodiments that can be combined with any other embodiment described herein, the asymmetric temperature-controlled shield may include a first asymmetric temperature-controlled shield 214 and a second asymmetric temperature-controlled shield 216 being arranged at opposite sides of each of the at least two evaporation sources. The first asymmetric temperature-controlled shield 214 may be a straight shield, i.e. the first temperature-controlled shield may not include a bent end. The first asymmetric temperature-controlled shields 214 may extend outwards from each of the evaporation sources i.e. the first asymmetric temperature-controlled shields 214 may be arranged at the first end of one of the at least two evaporation sources and at the second end of the other of the at least two evaporation sources or vice versa and the one and the other evaporation sources may be arranged next to each other.

According to embodiments that can be combined with any other embodiment described herein, the second asymmetric temperature-controlled shield 216 may include a straight portion and a bent end. The bent end may be bent away from the substrate or towards the other shield. A deposition area between the second asymmetric temperature-controlled shields 216 of adjacent evaporation sources is provided. The second asymmetric temperature-controlled shield 216 may extend inwards from each of the evaporation sources i.e. the second asymmetric temperature-controlled shields 216 may be arranged at the second end of one of the at least two evaporation sources and at the first end of the other of the at least two evaporation sources or vice versa and may extend towards each other. In particular, the bent ends may be bent towards each other i.e. the respective straight portions may be directed towards the substrate and the respective bent ends may optionally be directed away from the substrate. For example, the bent end may be bent by an angle with respect to the straight portion of the second asymmetric temperature-controlled shield.

Advantageously, such open shield design as described above between at least two evaporation sources allows for vacuum pumping but may still prevent stray coating of the material to be deposited. Further advantageously, the asymmetric shield arrangement, in particular the arrangement of two second asymmetric temperature-controlled shields as described above, prevents excessive cooling down of the substrate between the two evaporation sources where no active particle deposition takes place. Thus, the temperature brought into the material deposition apparatus by the evaporated material can be distributed more evenly, also between two evaporation sources, such that wrinkles in the substrate which can be e.g. a foil can effectively be prevented or avoided. In other words, the interface between two evaporation sources where normally the substrate would be cooled down since no or less material particles are present, can be bridged to allow for a uniform coating without damaging the substrate, caused by a fast temperature change between two evaporation sources.

It is to be understood that also more than two evaporation sources may be lined up along the substrate transportation direction and that between each of the evaporation sources an open shield design, i.e. an asymmetric shield design with two bent shields facing each other, may be provided.

Figure 2B:
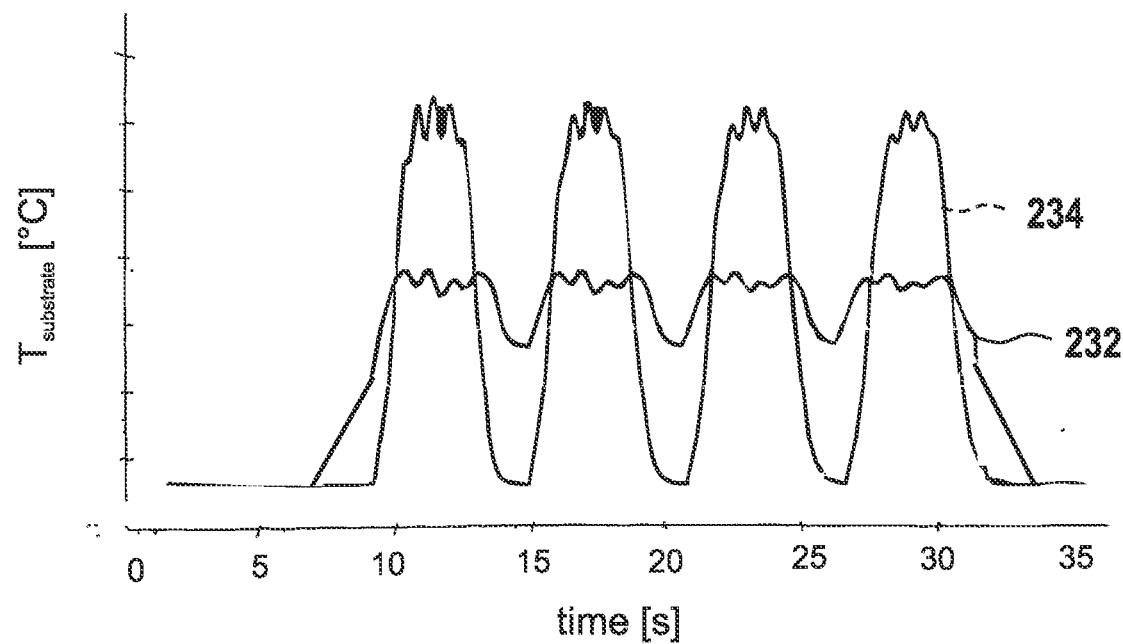
FIG. 2B shows a temperature profile at a substrate according to embodiments described herein.

The beneficial effect of the open shield design in combination with the open shield design between evaporation sources may be exemplarily seen in the diagram of FIG. 2B. FIG. 2B shows two temperature profiles where the x-axis is the time in seconds and the y-axis is the temperature at the substrate in ° C. The dotted line 234 shows a temperature profile of a material deposition apparatus including four evaporation sources lined up in the substrate transportation direction without the open shield design in between the evaporation sources and the solid line 232 shows a temperature profile of four evaporation sources lined up in the substrate transportation direction with the open shield design, i.e. with asymmetric temperature-controlled shields according to embodiments described herein in between the evaporation sources. Both curves show a temperature profile for the same deposition thickness, i.e. the overall deposition rate. Each of the plateaus may be regarded as the substrate being arranged directly above one of the evaporation sources. In other words, the x-axis representing the time indicates the time of a substrate section being moved over the four evaporation sources. Accordingly, before reaching the first plateau, the substrate may be regarded as being spatially in front of the first evaporation source i.e. on the left side of the left evaporation source shown in FIG. 2A. Due to the first temperature-controlled shield, the slope of the solid curve 232 is flatter than the slope of the dotted curve 234 where an extremely steep slope is detected when the substrate reaches the evaporation source (without the temperature-controlled shield on the left in FIG. 2A). Accordingly, and particularly due to the low mass of the substrate, the temperature at the substrate increases in a volatile way when no temperature-controlled shield is present at the evaporation source and remains at a very high level before the temperature drops very fast after the substrate has passed the first evaporation source.

In comparison, for the evaporation sources having an open shield design, the temperature of the substrate slowly increases and remains at a moderate level. Due to the bent shields in between the evaporation sources, no steep decrease in temperature is detected but the temperature remains almost constant even when the substrate is not positioned directly above an evaporation source. After material deposition has occurred, the decrease in temperature is smoother and flatter compared to the evaporation sources not having an open shield design.

Accordingly, the temperature at the substrate can be maintained more constantly and at a moderate level. Therefore, heat-related damage to the substrate can be avoided or prevented. Further, the temperature change in time can be reduced which reduces or prevents wrinkles or warpage of the substrate.

Figure 3:
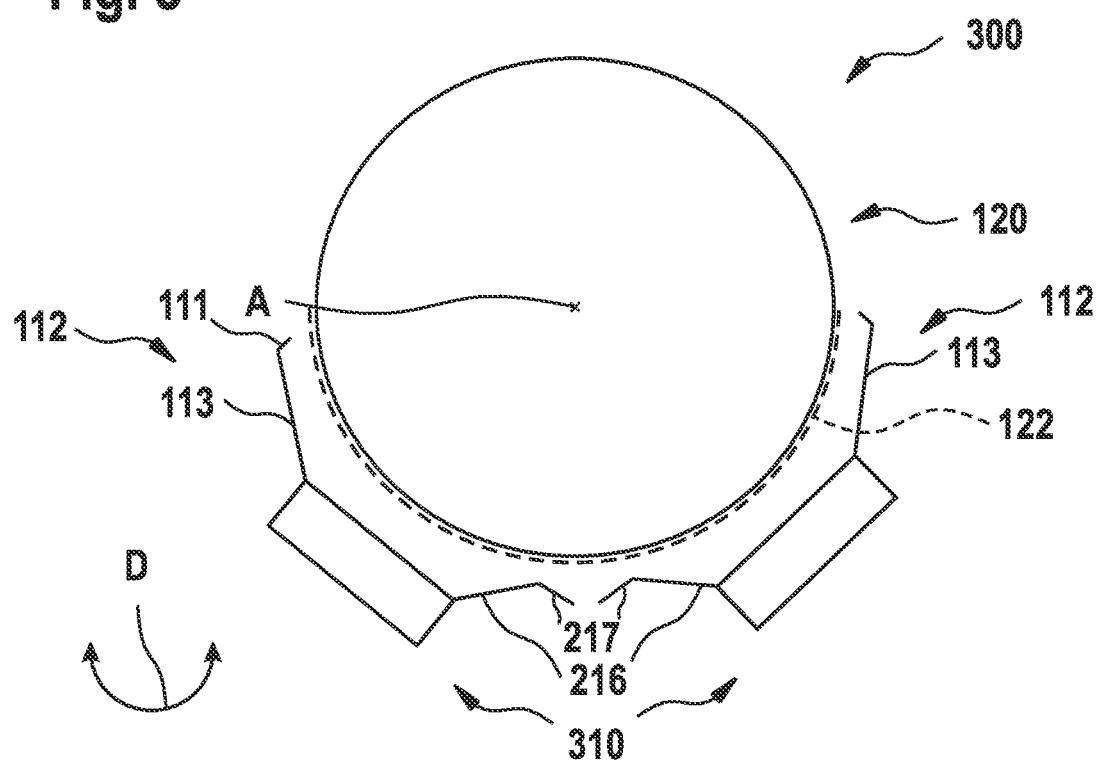
FIG. 3 shows a schematic view of a material deposition apparatus according to embodiments described herein.

According to embodiments that can be combined with any other embodiment described herein and with exemplary reference to FIG. 3, a material deposition apparatus 300 is provided herein having an open shield design and a temperature-controlled shield having a heating zone or a cooling zone. In other words, the material deposition apparatus shown in FIG. 3 may be regarded as a combination of the embodiments shown with respect to FIGS. 1 and 2A. Accordingly, the material deposition apparatus includes at least two evaporation sources 310 along a substrate transport direction D below a substrate transport device 120 transporting a substrate 122. The at least two evaporation sources 310 may include a first asymmetric shield (or shield portion) and a second asymmetric shield (or shield portion) being arranged at opposite sides of each of the at least two evaporation sources. The first asymmetric shield is a temperature-controlled shield according to embodiments described herein, i.e. the first asymmetric temperature-controlled shield may be a temperature-controlled shield 112 e.g. an elongated shield having a straight portion 113 and a bent end 111 as described with respect to FIG. 1 and, for example, providing an enlarged coating area. The second asymmetric shield may be a shield as described with respect to FIG. 2A, i.e. the second asymmetric temperature-controlled shield may include a straight portion 216 and a bent end 217 being e.g. bent away from the substrate and towards a second asymmetric temperature-controlled shield of another evaporation source of the at least two evaporation sources.

Transferring the beneficial effects as described herein of the embodiments described with respect to FIGS. 1 and 2A and returning to the temperature profile shown in FIG. 2B, a shield design as shown in FIG. 3 may lead to a flat increase of the temperature at the left side (representing the left side of the furthest evaporation source on the left) and a flat decrease of the temperature on the right side of the solid curve 232. Accordingly, the coating rate at the outermost positions on the left and the right of the evaporation sources is lowered such that an overall heat load, particularly a heat load increase or decrease, can be kept at a moderate level with regard to a complete deposition cycle where the substrate may pass all of the evaporation sources lined up in the substrate transportation direction.

According to embodiments that can be combined with any other embodiment described herein, an evaporation source for providing an evaporated material to a substrate in a vacuum chamber is provided. The evaporation source includes a nozzle assembly shield having a plurality of nozzles arranged in rows. Each of the rows includes two outermost nozzles. The two outermost nozzles are tilted in different directions. One row of the plurality of rows are shown for the evaporation sources 410 shown in FIG. 4A. A plurality of rows is arranged along the axis A of the transport device 120. One or more of the rows, and particularly 50% or more of the rows or all rows may have the tilted nozzles as illustrated and described with respect to FIG. 4A According to embodiments that can be combined with any other embodiment described herein, the evaporation source may have a first end and a second end and a surface between the first and the second end. The nozzle assembly shield may include a plurality of openings being arranged in at least one row, e.g. a plurality of rows, at the surface between the first end and the second end. The at least one row may have a first outermost opening provided adjacent to the first end and a second outermost opening provided adjacent to the second end.

According to embodiments that can be combined with any other embodiment described herein, the nozzle assembly shield may include a plurality of rows having a plurality of openings. The plurality of rows may be arranged in parallel at the surface, i.e. along the axis of the coating drum.

According to embodiments that can be combined with any other embodiment described herein, a plurality of nozzles may extend through the plurality of openings. The plurality of nozzles of one row may include a first outermost nozzle extending through the first outermost opening and a second outermost nozzle extending through the second outermost opening. The first and second outermost nozzle may be tilted by an angle with respect to the surface between the first end and the second end. For example, the first and second outermost nozzle may be tilted by an angle that corresponds to the angle α as shown in FIG. 1. Additionally or alternatively, the first and second outermost nozzles may be tilted by an angle between 5° and 25°, more particularly, 5° and 15°, even more particularly 5° and 10°.

Figure 4A:
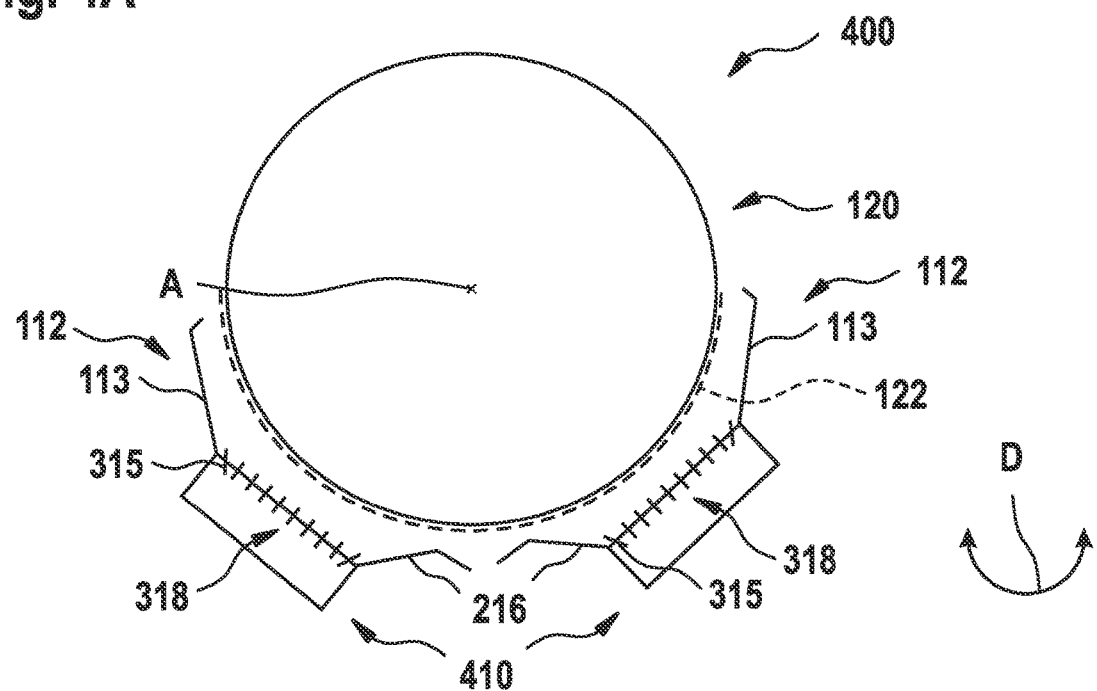
FIG. 4A shows a schematic view of a material deposition apparatus according to embodiments described herein.

According to embodiments that can be combined with any other embodiment described herein and with exemplary reference to FIG. 4A, a material deposition apparatus 400 for depositing an evaporated material onto a substrate is provided. The material deposition apparatus may include an evaporation source according to embodiments described herein, i.e. an evaporation source including a nozzle assembly shield as described above. The material deposition apparatus may further include one or more temperature-controlled shields according to any of the embodiments described herein. Accordingly, the material deposition apparatus 400 may include any combination of an elongated shield or shield 112 having e.g. a straight portion 113 and a bent end 111 as described with respect to FIG. 1 and any of a first and second asymmetric shields as described with respect to FIG. 2A.

According to embodiments, the material deposition apparatus may include at least two evaporation sources distributed along the substrate transportation direction D. The at least two evaporation sources may each include a distributor and a crucible as described herein. Further, the at least two evaporation sources may include a plurality of openings being arranged in at least one row, for example, a plurality of rows extending along the axis of the coating drum. The at least one row extends from the first end of each of the at least two evaporation sources to the respective second ends. The plurality of openings may include the plurality of nozzles 318 for providing the evaporated material to the substrate. The plurality of openings may include a first outermost opening adjacent to the respective first ends and a second outermost opening adjacent to the respective second ends of the at least two evaporation sources. Through the first outermost opening and the second outermost opening, a first and a second outermost nozzle may be provided.

According to embodiments that can be combined with any other embodiment described herein, the first and second outermost nozzles 315 may be tilted in different directions. For example, each of the first and second outermost nozzles may be tilted in a direction similar to the temperature-controlled shields being arranged directly next to the tilted nozzle. In other words, when the tilted nozzle is arranged adjacent to the first end, the nozzle may be tilted in a direction similar to the temperature-controlled shield arranged at the first end of the evaporation source and when the tilted nozzle is arranged adjacent to the second end, the tilted nozzle may be tilted in a direction similar to the direction of the temperature-controlled shield arranged at the second end. More particularly, a tilt angle of the respective tilted nozzle may be similar to the angle of the respective straight portions 113, 216 of the respective temperature-controlled shields.

Figure 4B:
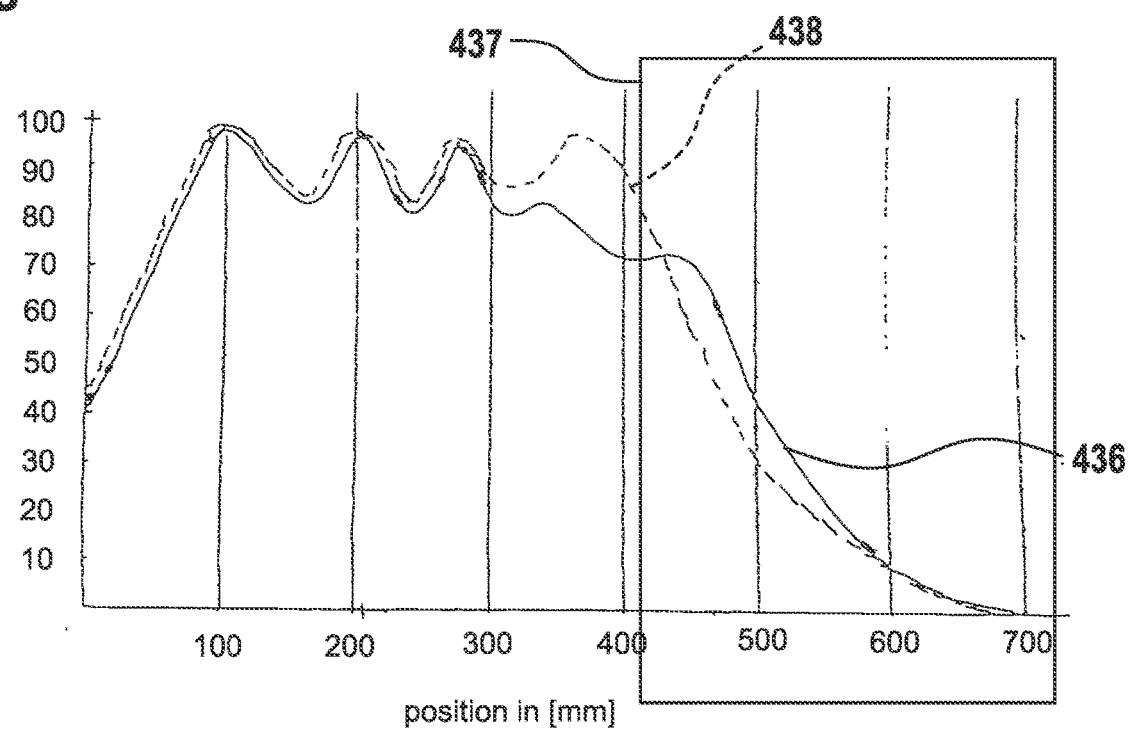
FIG. 4B shows a heat load profile at a substrate according to embodiments described herein.
Figure 5:
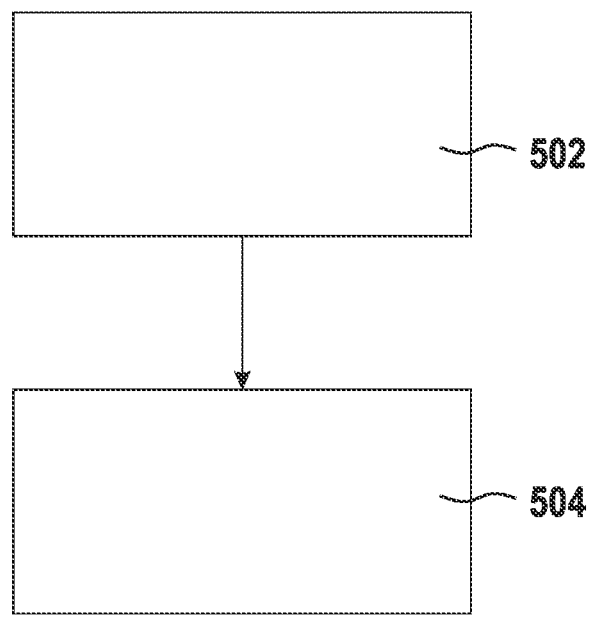
FIG. 5 shows a flow diagram of a method according to embodiments described herein.

The beneficial effect of the tilted nozzle design in combination with the open shield design including an elongated temperature-controlled shield as shown in FIG. 4A, may be exemplarily seen in the diagram of FIG. 4B. FIG. 4B shows two heat loads of two evaporation sources with the respective temperature-controlled shield designs and with or without the tilted nozzles. The dotted line 438 shows a heat load of evaporation sources without tilted nozzles and the solid line 436 shows a heat load of evaporation sources with tilted nozzles.

In the diagram shown, the x-axis is the position of the substrate measured in the total length spanned by the evaporation sources, e.g. the total length of four evaporation sources being distributed along the substrate transportation direction. The y-axis describes the layer thickness normed to percent [%], i.e. the y-axis provides a relative measure for the amount of material that is deposited on the substrate. In other words, the y-axis provides for the percentage of a beneficial layer thickness achieved with the material deposition apparatus. Since the heat load is dependent on the amount of material deposited on the substrate, the relative layer thickness may provide information about the relative heat load at the various positions.

It is beneficial to achieve high deposition yields, i.e. layer thicknesses of 5 to 100 μm. However, the more material is deposited onto the substrate, the greater the condensation energy provided to the substrate resulting in a high temperature of the substrate which may damage the substrate e.g. which leads to wrinkle formation of e.g. the foil substrate. In addition, the maximum temperature of the foil is limited by the melting temperature of the deposited material. In the case of Li, the maximum temperature of the substrate is beneficially well below (e.g. 20° C. below) the melting temperature of the material, which is 180° C. in the case of Li. Accordingly, it is beneficial to provide a smooth increase of temperature at the substrate to prevent temperature-related damage of the substrate while still achieving high deposition rates and particularly at the same layer thickness deposited in the process.

The solid curve 436 in FIG. 4B in box 437 shows that the set up including the tilted nozzles smoothens the increase in temperature even further compared to the profile of curve 438 where the nozzles were not tilted. Accordingly, the combination of the temperature-controlled shields and the use of tilted outermost nozzles provide for a smooth increase in temperature while still providing for high deposition yields.

According to embodiments that can be combined with any other embodiment described herein, a method for depositing a material onto a substrate in a vacuum chamber is provided. At operation 502, the material is evaporated in an evaporation source having a vapor emission area. At operation 504, the evaporated material is guided by a temperature-controlled shield towards a substrate area, the substrate area being larger than the vapor emission area. According to some embodiments, the substrate area is larger in the transport direction of the substrate. For example, the substrate area outside the emission area has a deposition rate that is smaller than the deposition rate in the emission area, particularly at least 10% of the substrate area outside the emission area has a deposition rate that is at least 50% smaller than the deposition rate in the emission area. According to some embodiments, the substrate may be evaporated with an evaporation apparatus according to embodiments of the present disclosure and/or may be guided with a temperature-controlled shield according to embodiments of the present disclosure.

According to yet further embodiments, a method of manufacturing an anode of a battery is provided. The method may include a method for depositing a material onto a substrate in a vacuum chamber according to any of the embodiments described herein.

According to yet further embodiments, a method of manufacturing an anode of a battery is provided. The method may include guiding a web comprising or consisting of an anode layer in a material deposition apparatus according to any the embodiments described herein and depositing a lithium containing material or lithium on the web with the vapor deposition apparatus.

According to some embodiments, which can be combined with other embodiments described herein, for the method of manufacturing an anode of a battery, the web comprises copper or consists of copper. According to some implementations, the web may further comprise graphite and silicon and/or silicon oxide. For example, the lithium may pre-lithiate the layer including graphite and silicon and/or silicon oxide.

In particular, the following embodiments are described herein:

Embodiment 1. A temperature-controlled shield for an evaporation source, the temperature-controlled shield being configured to provide a pre-heating zone or a post-cooling zone.

Embodiment 2. The temperature-controlled shield for an evaporation source of embodiment 1, wherein the temperature-controlled shield comprises one of a heating device or a cooling device.

Embodiment 3. The temperature-controlled shield for an evaporation source of embodiments 1 or 2, wherein the temperature-controlled shield is arranged at the evaporation source and extends outward from the evaporation source.

Embodiment 4. The temperature-controlled shield for an evaporation source of embodiments 1 to 3, wherein the temperature-controlled shield comprises a straight portion and a bent end.

Embodiment 5. The temperature-controlled shield for an evaporation source of embodiment 4, wherein the bent end extends away from the evaporation source in a direction towards the substrate support and particularly substantially parallel to an orientation of the evaporation source.

Embodiment 6. The temperature-controlled shield for an evaporation source of embodiments 1 to 5, wherein temperature-controlled shield comprises a heat-conducting material.

Embodiment 7. A material deposition apparatus for depositing an evaporated material onto a substrate, the material deposition apparatus comprising: one or more temperature-controlled shields of embodiments 1 to 6.

Embodiment 8. A material deposition apparatus for depositing an evaporated material onto a substrate, the material deposition apparatus comprising an evaporation source for providing the evaporated material to the substrate, the evaporation source having a first end and a second end opposite the first end and a surface having a length in between the first end and the second end; and one or more temperature-controlled shields being arranged at at least one of the first end or the second end of the evaporation source, the one or more temperature-controlled shields extending outward from the evaporation source, wherein the one or more temperature-controlled shields provide a width of at least 20% of the length of the surface in between the first end and the second end of the evaporation source.

Embodiment 9. A material deposition apparatus for depositing an evaporated material onto a substrate, the material deposition apparatus comprising an evaporation source for providing the evaporated material to the substrate, the evaporation source having a first end and a second end opposite the first end; and one or more temperature-controlled shields being arranged at at least one of the first end or the second end of the evaporation source, the one or more temperature-controlled shields extending outward from the evaporation source by a wide-angle.

Embodiment 10. The material deposition apparatus for depositing an evaporated material onto a substrate of embodiments 7 to 9, wherein the wide-angle is between 95° and 180°.

Embodiment 11. The material deposition apparatus for depositing an evaporated material onto a substrate of embodiments 7 to 10, wherein the one or more temperature-controlled shields extend towards the substrate transportation device and being configured to provide a heating zone or a cooling zone, particularly to provide a pre-heating zone or a post-cooling zone.

Embodiment 12. The material deposition apparatus for depositing an evaporated material onto a substrate of embodiments 7 to 11, the material deposition apparatus further comprising: a substrate transportation device arranged above the evaporation source.

Embodiment 13. A material deposition apparatus for depositing an evaporated material onto a substrate, the material deposition apparatus comprising: a substrate transportation device for transporting the substrate along a substrate transportation direction; and at least two evaporation sources along the substrate transportation direction for providing the evaporated material to the substrate, the at least two evaporation sources each comprising one or more asymmetric temperature-controlled shields.

Embodiment 14. The material deposition apparatus for depositing an evaporated material onto a substrate of embodiment 13, wherein the two asymmetric temperature-controlled shields are arranged at opposing sides of each of the at least two evaporation sources, and wherein the two asymmetric temperature-controlled shields extend towards the substrate transportation device in different directions.

Embodiment 15. The material deposition apparatus for depositing an evaporated material onto a substrate of embodiments 13 or 14, wherein the second temperature-controlled shields of the at least two evaporation sources are arranged adjacent to each other and wherein the second temperature-controlled shields are bent away from the substrate and/or towards each other.

Embodiment 16. The material deposition apparatus for depositing an evaporated material onto a substrate of embodiments 13 to 15, wherein the first asymmetric temperature-controlled shield is a temperature-controlled shield of embodiments 1 to 6.

Embodiment 17. The material deposition apparatus for depositing an evaporated material onto a substrate of embodiments 7 to 16, the material deposition apparatus further comprising: a vacuum chamber housing at least the temperature-controlled shield.

Embodiment 18. The material deposition apparatus of embodiments 7 to 16 when depending directly or indirectly upon embodiment 13, wherein the two asymmetric temperature-controlled shields are configured to provide material between the at least two evaporation sources and/or to provide a deposition area from a first end of a first deposition source to a second end of a second deposition source.

Embodiment 19. An evaporation source for providing an evaporated material to a substrate in a vacuum chamber, the evaporation source comprising: a nozzle assembly shield having a plurality of nozzles arranged in at least one row, the row including two outermost nozzles, wherein the two outermost nozzles are tilted in different directions.

Embodiment 20. An evaporation source for providing an evaporated material to a substrate in a vacuum chamber, the evaporation source comprising: a nozzle assembly shield having a first end and a second end and a surface between the first and the second end facing the substrate, the nozzle assembly shield having a plurality of openings being arranged in at least one row at the surface between the first end and the second end, the at least one row having a first outermost opening provided adjacent to the first end and a second outermost opening provided adjacent to the second end; and a plurality of nozzles extending through the plurality of openings, wherein the plurality of nozzles comprises a first outermost nozzle extending through the first outermost opening and a second outermost nozzle extending through the second outermost opening, the first and second outermost nozzle being tilted by an angle with respect to the surface between the first end and the second end.

Embodiment 21. The evaporation source of embodiment 20, wherein the angle is between 5° and 25°, more particularly, 5° and 15°, even more particularly 5° and 10.

Embodiment 22. The material deposition apparatus for depositing an evaporated material onto a substrate of embodiments 7 to 19, the material deposition apparatus comprising at least one evaporation source of embodiments 20 or 21.

Embodiment 23. A method for depositing a material onto a substrate in a vacuum chamber, the method comprising: evaporating the material in an evaporation source having a vapor emission area; and guiding the evaporated material by a temperature-controlled shield towards a substrate area, the substrate area being larger than the vapor emission area.

Embodiment 24. The method of embodiment 23, wherein the substrate area is larger in the transport direction of the substrate.

Embodiment 25. The method of embodiments 23 to 24, wherein the substrate area outside the emission area has a deposition rate that is smaller than the deposition rate in the emission area, particularly at least 10% of the substrate area outside the emission area has a deposition rate that is at least 50% smaller than the deposition rate in the emission area.

Embodiment 26. A method of manufacturing an anode of a battery, comprising: a method for depositing a material onto a substrate in a vacuum chamber of embodiments 23 to 25.

Embodiment 27. A method of manufacturing an anode of a battery, comprising: guiding a web comprising or consisting of an anode layer in a material deposition apparatus of embodiments 7 to 19; and depositing a lithium containing material or lithium on the web with the vapor deposition apparatus.

Embodiment 28. The method of embodiment 27, wherein the web comprises copper.

Embodiment 29. The method of embodiment 27, wherein the web comprises graphite and silicon and/or silicon oxide.

Embodiment 30. The method of embodiment 29, wherein the anode layer is pre-lithiated.

While the foregoing is directed to embodiments of the disclosure, other and further embodiments of the disclosure may be devised without departing from the basic scope thereof, and the scope thereof is determined by the claims that follow.

The invention claimed is:

1. A material deposition apparatus for depositing an evaporated material onto a substrate, the material deposition apparatus comprising:
   an evaporation source comprising a plurality of nozzles including two outermost nozzles, the two outermost nozzles being tilted in different directions from each other; and
   one or more temperature-controlled shields arranged at a wide-angle between 110° and 140° with respect to the evaporation source so that the evaporated material is deposited in an area having a width of at least 10% larger than a corresponding width of the evaporation source, each of the one or more temperature-controlled shields being configured to provide a pre-heating zone or a post-cooling zone.

2. The material deposition apparatus for depositing an evaporated material onto a substrate according to claim 1, wherein the one or more temperature-controlled shields comprise one of a heating device or a cooling device.

3. The material deposition apparatus for depositing an evaporated material onto a substrate according to claim 1, wherein the one or more temperature-controlled shields are arranged at the evaporation source and extends outward from the evaporation source.

4. The material deposition apparatus for depositing an evaporated material onto a substrate according to claim 1, wherein the one or more temperature-controlled shields comprise a straight portion and a bent end.

5. The material deposition apparatus for depositing an evaporated material onto a substrate according to claim 4, wherein the bent end extends away from the evaporation source in a direction towards a substrate support.

* * * * *